United States Patent [19]
Klimovitsky et al.

[11] Patent Number: 5,280,239
[45] Date of Patent: Jan. 18, 1994

[54] POSITION SENSOR UTILIZING PRIMARY AND SECONDARY COILS WOUND ON A TOROIDAL CORE WITH FLUX CONCENTRATORS

[76] Inventors: Vladimir A. Klimovitsky, 6 Hamilton Rd., Apt. 6-G, Brookline, Mass. 02146; Alexandr M. Klimovitsky, 243 Broadway, Apt. 502, Cambridge, Mass. 02139

[21] Appl. No.: 498,860

[22] Filed: Mar. 26, 1990

[51] Int. Cl.$^5$ .................... G01B 7/14; G01R 33/04
[52] U.S. Cl. .................... 324/207.26; 324/207.17; 324/253
[58] Field of Search .................... 324/253–255, 207.16, 207.17, 207.24, 207.25, 207.26; 340/870.33

[56] References Cited

U.S. PATENT DOCUMENTS

| | | | |
|---|---|---|---|
| 2,480,265 | 8/1949 | Rubenstein | 324/253 |
| 2,991,414 | 7/1961 | Tillman | 340/870.33 |
| 3,777,255 | 12/1973 | Young et al. | 324/207.17 |
| 4,627,292 | 12/1986 | Dekrone | 324/207.26 |

Primary Examiner—Walter E. Snow

[57] ABSTRACT

Device for measuring intensity of magnetic field, displacement, speed and acceleration of magnetized and ferromagnetic objects in external magnetic field including source of external magnetic field, sensor sensing intensity of magnetic field and having toroid type ferromagnetic core, primary and secondary windings, circuitry for activating primary winding with alternative current, circuitry' for detecting and measuring peak voltage of the output pulses at the secondary winding, components controlling intensity of external magnetic field. Displacement of controlled objects in external magnetic field changes intensity of the magnetic field near the sensor. This displacement is measured by measuring peak voltage of the output pulses. The alternative current in primary winding induces positive and negative output pulses in secondary winding, remagnetizing the core along the hysteresis loop. For internal magnetic field core has closed magnetic circuit and for external magnetic field sensor has open magnetic circuit. External magnetic field modulates internal magnetic field, changes permeability of the core and remagnetization hysteresis loop area. Intensity of external magnetic field near the core depends on strength of external magnetic field, distance between source and sensor, polarity of source, relative position of source, sensor and controlled ferromagnetic object in external field. Device can read magnetic data on magnetic media including magnetic films (disks, tapes) allowing significantly increase density of magnetic data and speed of its retrieval, be used as high sensitivity, linearity and accuracy acoustic sensor (microphone, hydrophone, laryngophone, geophone), in automobile, mining, railroad, factory automation industries, machine tools etc.

17 Claims, 9 Drawing Sheets

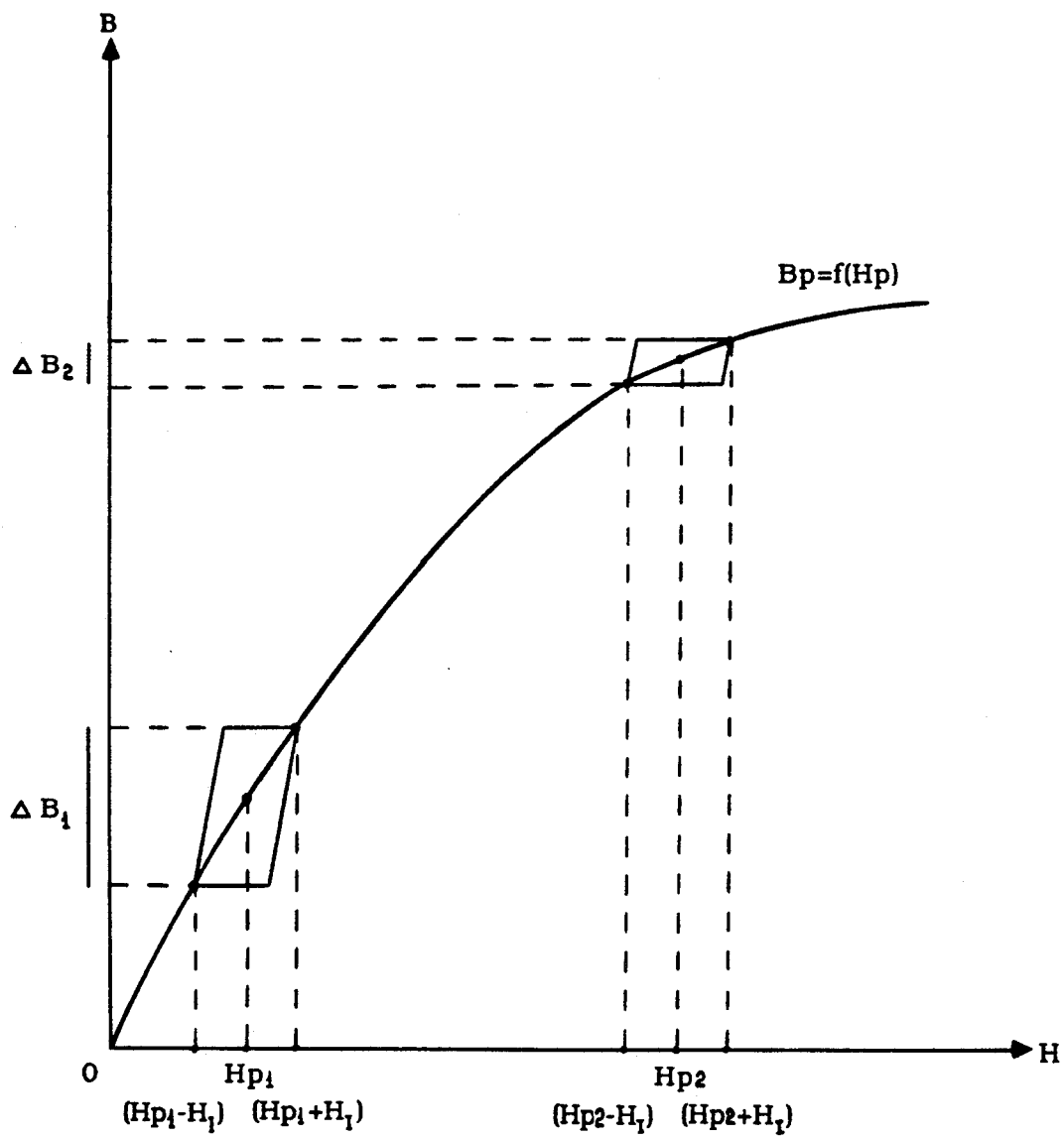
FIG. 3.a

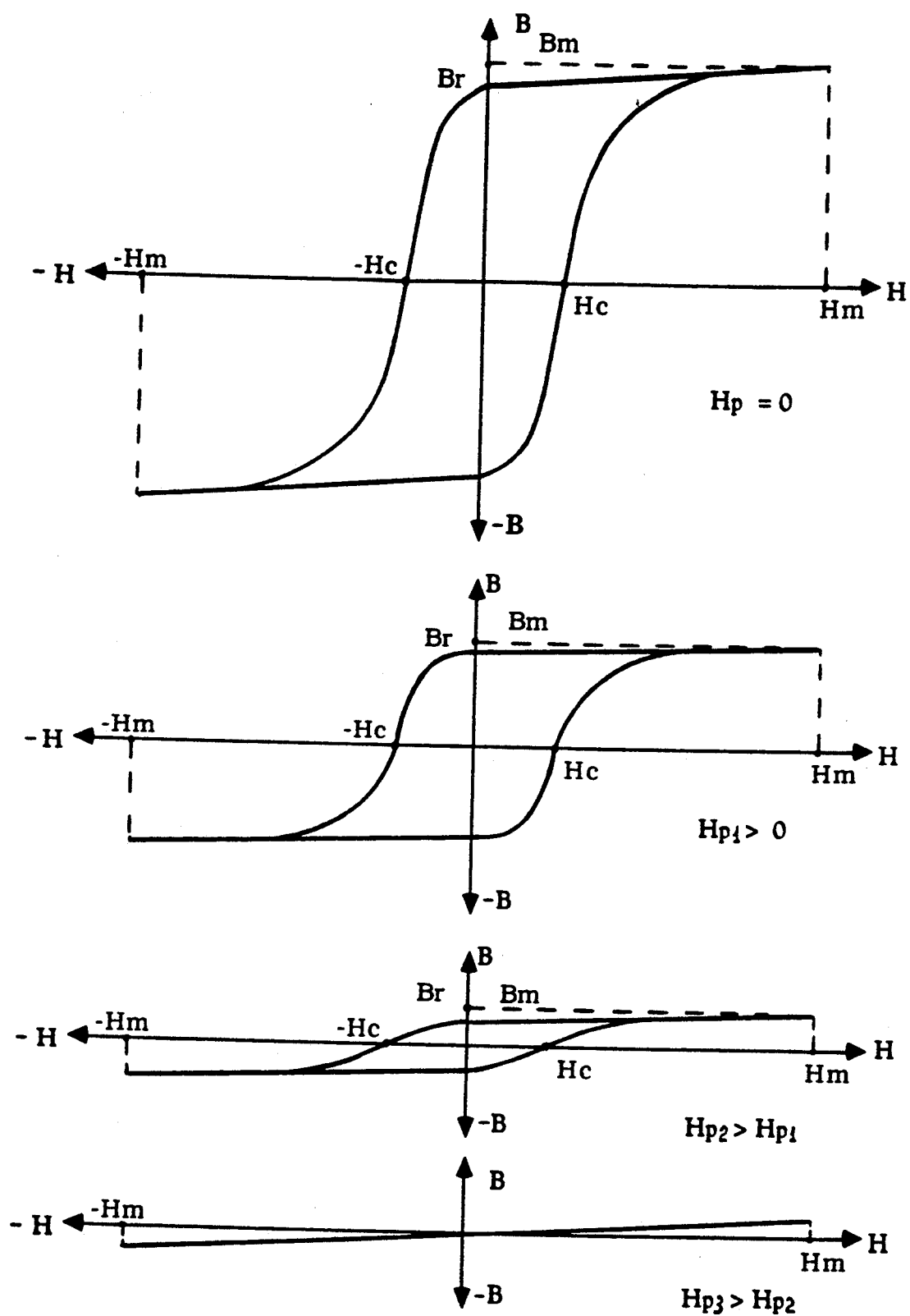
FIG. 3.b

3
4
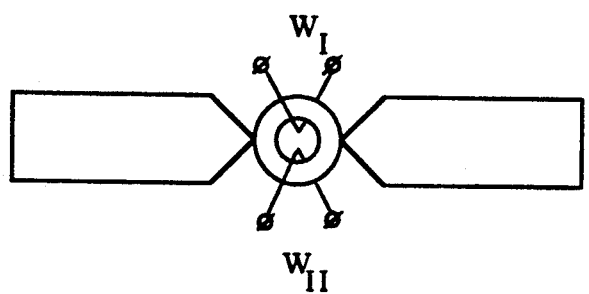
FIG. 7

POSITION SENSOR UTILIZING PRIMARY AND SECONDARY COILS WOUND ON A TOROIDAL CORE WITH FLUX CONCENTRATORS

FIELD OF THE INVENTION

The invention relates to measurement instrumentation and automated checking and control equipment. It is designated to use in automated measurement and control systems.

BACKGROUND OF THE INVENTION

The magnetic transducers and converters provide non-contact detection and measurement, supreme quality specifications, ability to operate in heavy and hazardous environments and others.

Hall effect devices are well known among the magnetic measuring devices. These devices basically are discrete elements (on-off switches). Their operating principle is based on appearance of voltage between edges of semiconductor crystal when electric current, and magnetic field in the direction, perpendicular to a direction of the current, are applied to the crystal (P. Horowitz, W. Hill "The Art of Electronics", 14.05. Magnetic Field, page 607, Cambridge University Press, 1980). The main disadvantage of Hall effect devices is their low efficiency coefficient. To obtain relatively large electric voltage on the output of Hall effect transducer, magnetic fields of significant intensity should be applied.

Ferreeds are also well known. Converters with discrete operating principle are designed on the basis of these ferreeds: the constant magnetic field of the electromagnet controls the state of the electric contacts, compensating mechanical forces of their elasticity (Van Nostrand's Scientific Encyclopedia, section "Ferreed", page 1165, Van Nostrand Reinhold Company, 1983; and Engineers' Relay Handbook, section "Ferreed Relays", page 68, Hayden Book Company Inc., New York, 1969). The inertia, presence of contacts, relatively low sensitivity and dispersion of parameters are the main disadvantages of these converters.

The ferromagnetic sond-modulators with frequency doubling are also known to play a role in measurement converters. They can be used to measure the Earth's magnetic field, for geomagnetic prospecting of mineral resources, in remotely controlled magnetic compasses, in mine detectors, and other applications. Their operating principles are based on the appearance of ferromagnetic coupling between an input and an output windings placed in some specific manner. This coupling occurs due to the periodic change of differential magnetic permeability of the cores, only when constant external magnetic field is applied to it (Van Nostrand's Scientific Encyclopedia, Magnetometer (flux-gate), page 1808, Van Nostrand Reinhold Company, 1983). The design including the ferromagnetic sondes is relatively complicated, bulky and requires significant supplemental circuitry.

Magneto-resistive semiconductor elements are also well known. Their operating principle is based on change of electric resistance of the solid in a magnetic field (McGraw-Hill Concise Encyclopedia of Science & Technology, Magnetoresistance, page 1025, McGraw-Hill, Inc, 1984). Disadvantages of the transducers based of this principle include narrow dynamic range of the detected changes of the magnetic field.

There is another discrete operation device for a remote control which contains the source of external magnetic field, sensor and output device (Avtorskoe Svidetelstvo (Transl. from Russian: Inventor's Certificate) No. 132660, Klimovitsky A. M. and others, USSR, State Committee for Inventions and Discoveries). The operating principle of this device is the closest to the operating principle of the proposed magnetic converter. This device can be considered as a prototype of the proposed converter.

The proposed magnetic measuring converter allows to solve a number of problems. The most important of them are reflected in the purpose of invention described in the summary.

SUMMARY OF THE INVENTION

The purpose of the invention consists in providing:

the possibility to design different transducers and measuring converters of different designations for non-contact control and measurement of different physical quantities, both analog and discrete, high level of sensitivity, accuracy, linearity, repeatability of measurements, speed of response, and absence of hysteresis in the external characteristic, and also high maintenance reliability, wide range of measurements of speed and acceleration of the controlled objects, starting from zero, the flexibility to set, modify and correct parameters of the technical specification, The converter allows to provide precise measurement of displacement, speed and acceleration of the magnetized objects and ferromagnetic objects in the external magnetic field directly affecting and changing the intensity of said external magnetic field near the sensor. Such measurement of the displacement is performed by measuring the intensity of the magnetic field, the measurement of speed is performed by measuring the speed of change of the intensity, and the measurement of acceleration is done by measuring the acceleration of change of the intensity. Therefore, displacement, speed and acceleration are converted into the intensity of the magnetic field or its speed and acceleration of change, and this value of intensity is measured.

The magnetic measuring converter includes a magnetic measuring transducer measuring intensity of the magnetic field (corresponding to some value of the measured parameter). This transducer includes source of external magnetic field, a sensor sensitive to the intensity of the magnetic field, toroidal ferromagnetic core and primary and secondary windings. To increase magnetic sensitivity the sensor has special elongated attachments made of non-retentive material having high magnetic permeability in weak magnetic fields and low residual induction in open magnetic circuit. These attachments attached to free of windings sectors of the core and concentrate and focus the flux of the concentrated external magnetic field into the core by the sharpen edges tightly attached to the core. Primary winding is activated by the alternative current or pulse current. Output pulses at the output of the secondary winding are detected and measured giving the corresponding value of the magnetic field intensity.

The alternative current in the primary winding creates an internal magnetic field directed along the closed magnetic circuit of the ferromagnetic core and contained entirely within the core. The internal magnetic field induces positive and negative output pulses in the secondary winding and provides remagnetization of the core along the hysteresis loop of the ferromagnetic material of the core. The peak voltage of the output pulses proportional to the time derivative of the internal magnetic field induction changed from a maximum value to a minimum value (zero) on the hysteresis loop and, therefore, a minimum area of remagnetization hysteresis loop of the core is equal zero when the core is magnetically saturated by the external field.

For the internal magnetic field the core has a closed magnetic circuit where magnetic lines of force of said internal field are closed within the ferromagnetic material of the core; for the external magnetic field the sensor is a ferromagnetic object with an open magnetic circuit which is a section of a larger, external magnetic circuit. Such open magnetic circuit is a section of the magnetic path where magnetic lines of force of said external magnetic field go through.

The external magnetic field is quasi-constant and superimposed on the internal magnetic field. The external magnetic field modulates the internal magnetic field in the core. Change in intensity of the external magnetic field changes magnetic permeability of the core, the range of the induction change, and the area of remagnetization hysteresis loop of the core from zero (when the core is magnetically saturated) to a maximum value (when the external magnetic field is shunted or switched off, and the core is remagnetized along the maximum hysteresis loop.

Change of the measured intensity of the external magnetic field is converted by the sensor to a change of the voltage at the secondary terminals.

Sensitivity of the measurements of intensity, displacement, speed and acceleration is being increased when size of the core (a perimeter of the closed magnetic circuit and an area of the cross-section) is being reduced, because the magnetic field of smaller intensity can be used to saturate the core of smaller size. For example, it is advantageous to apply methods and technologies used in IC manufacturing and assembly, to make a transducer for miniature applications. Herewith, a speed of response of these measurements is equal to semi-period of the alternative current activating the primary winding, which means it can be in the range of a microsecond; the frequency of this alternative current depends on a particular application.

Hysteresis of the external characteristic is substantially zero providing high level of repeatability of the measurements.

The intensity of the external magnetic field can be controlled by modifying following parameters: strength of the external magnetic field; distance between the source and the sensor; polarity of the source; relative position of the source and the sensor; relative to the sensor position coordinates of the controlled ferromagnetic object in the external magnetic field; relative to the sensor position coordinates of the controlled magnetized object; and also providing: redistribution of the magnetic fluxes in space (partial or complete shunting), relative rotation of the sensor with respect to a direction of the external magnetic field.

Magnetic circuit of the converter can be formed by parallel, coaxial, mobile, immobile (rigidly connected to each other) configurations of the source of external magnetic field (direct current electromagnet or permanent magnet), and the sensor having miniature toroid ferromagnetic core with the rectangular hysteresis loop, primary and secondary windings winded on the opposite sectors of the core, and the attachments concentrating and focusing the field near the core.

The proposed magnetic measuring converter includes controlled clock-generator, signal conditioner, comparator, output device, device for manual input of set parameters (keyboard, switches, regulators, etc.), setting elements, analog-to-digital converter, microprocessor and stabilized power supply which are described in section "Detailed Description of the Invention".

The output signals of the sensor (from its secondary winding) are supplied to the analog processing circuitry including conditioner, comparator and output device. At first, these signals go to the input of the conditioner, then the conditioned signals form the output of the signal conditioner are supplied to an input of the comparator which output is connected to the output device. The conditioner, the comparator and the output device compose a series functional circuit to process the detected and measured signals in analog form. To process the output signals in digital form analog processing circuitry is supplemented by a digital processing circuitry including analog-to-digital converter, microprocessor and output device. The microprocessor is being clocked by the controlled clock-generator synchronizing the supply of the alternative current into the primary winding of the sensor. The manual input device is being used to manually input the required parameters into the converter. These parameters are being set by the setting elements (these are physical electronic components) to set properly the manually input control data. Direct current in the electromagnet is being stabilized by a highly stable power supply.

BRIEF DESCRIPTION OF THE DRAWING

The features of the present invention are described in greater detail in the following section "Detailed Description of the Invention" and the accompanying drawing, in which:

FIG. 3 a. shows the effect of superposition of the external constant magnetic field $B_p = F(H_p)$ on the alternative circular field $\Delta B = f(H_I)$ of primary winding;

FIG. 3b. shows oscillograms of the changes of hysteresis loop due to the remagnetization of the sensor's core starting from a state where the external field is off to a state of the complete saturation of the core;

FIG. 7 shows a situation where a displacement of the controlled object causes redistribution (partial or entire shunting) of the magnetic fluxes of the external field in space;

DESIGNATIONS ON THE FIGS. 1-8

1-transducer, 2-electronic block,
3-source of external magnetic field (SEMF),
4-sensor (SE),
5-controlled clock generator,
6-signal conditioner,
7-comparator,
8-manual input device,
9-setting elements,
10-output device,
11-analog-to-digital converter,
12-microprocessor,
13-stabilized power supply,
14-working clearance "l",
N-North-pole of the permanent magnet,
S-South-pole of the permanent magnet,
$W_I$-primary winding of the sensor,
$W_{II}$-secondary winding of the sensor,
$W_O$-auxiliary winding,
$U_I$-voltage on the primary winding,
$U_{II}$-voltage on the secondary winding,
$B_p = f(H_p)$-the relationship of the induction $B_p$ and the intensity $H_p$ when the core of the sensor is magnetized by the external field in the diameter plane of the toroidal core,
$\Delta B$-the range of circular field induction corresponding to the intensity $H_I$ created by primary winding $W_I$,

| | |
|---|---|
| $B_m$- maximum induction, | |
| $H_m$- maximum intensity, | Elements of the hysteresis cycle, |
| $B_r$- residual induction, | |
| $H_c$- coercitivity force. | |

DETAILED DESCRIPTION OF THE INVENTION

Figure 1:
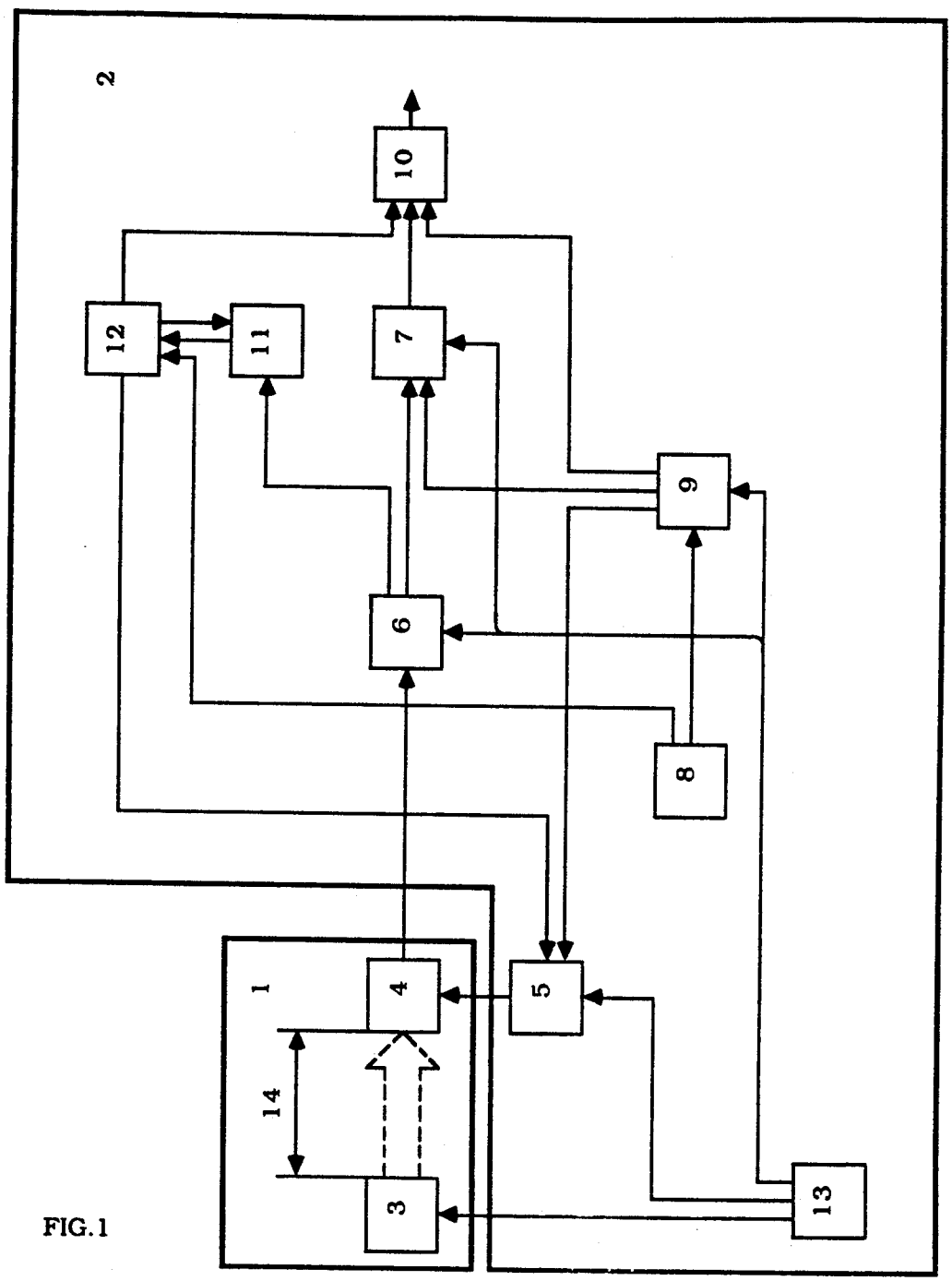
FIG. 1 is a functional block diagram of the measuring converter.

The magnetic measuring converter includes two main parts (FIG. 1): measuring transducer 1 and the electronic block 2.

The transducer 1 (FIG. 2) includes a source of external magnetic field 3 (which can be electromagnet or permanent magnet) and a sensor 4.

The sensor has toroid ferromagnetic core with rectangular hysteresis characteristic, and primary and secondary windings winded on the opposite sectors of the core. To concentrate and focus the magnetic flux of the external field, special focusing attachments are attached to free of the windings sectors of the core. In order to avoid an influence of these attachments on the magnetic state of the core at absence of the external magnetic field, these attachments have to be made of material having high magnetic permeability in weak fields and low residual induction in open magnetic circuit. The edges of these attachments are preferably sharpen to avoid or reduce influence of the attachments on the distribution of the magnetic fluxes in the core during its remagnetization cycle. The attachments increase the sensitivity range of the magnetic sensor.

Operating principle of the transducer is based on a control of magnetic state of the ferromagnetic core having substantially rectangular hysteresis characteristic. Such control is done by creating the external quasi-constant magnetic field in the space near the core and modulating the internal magnetic field in the core by the external magnetic field.

If an alternative voltage (in the particular case-pulse voltage) $U_I$ is applied to the primary winding $W_I$ when the external magnetic field is not applied, the core is remagnetized along the maximum hysteresis loop curve, and different polarity pulses $U_{II}$ are induced in the secondary winding $W_{II}$.

Figure 2:
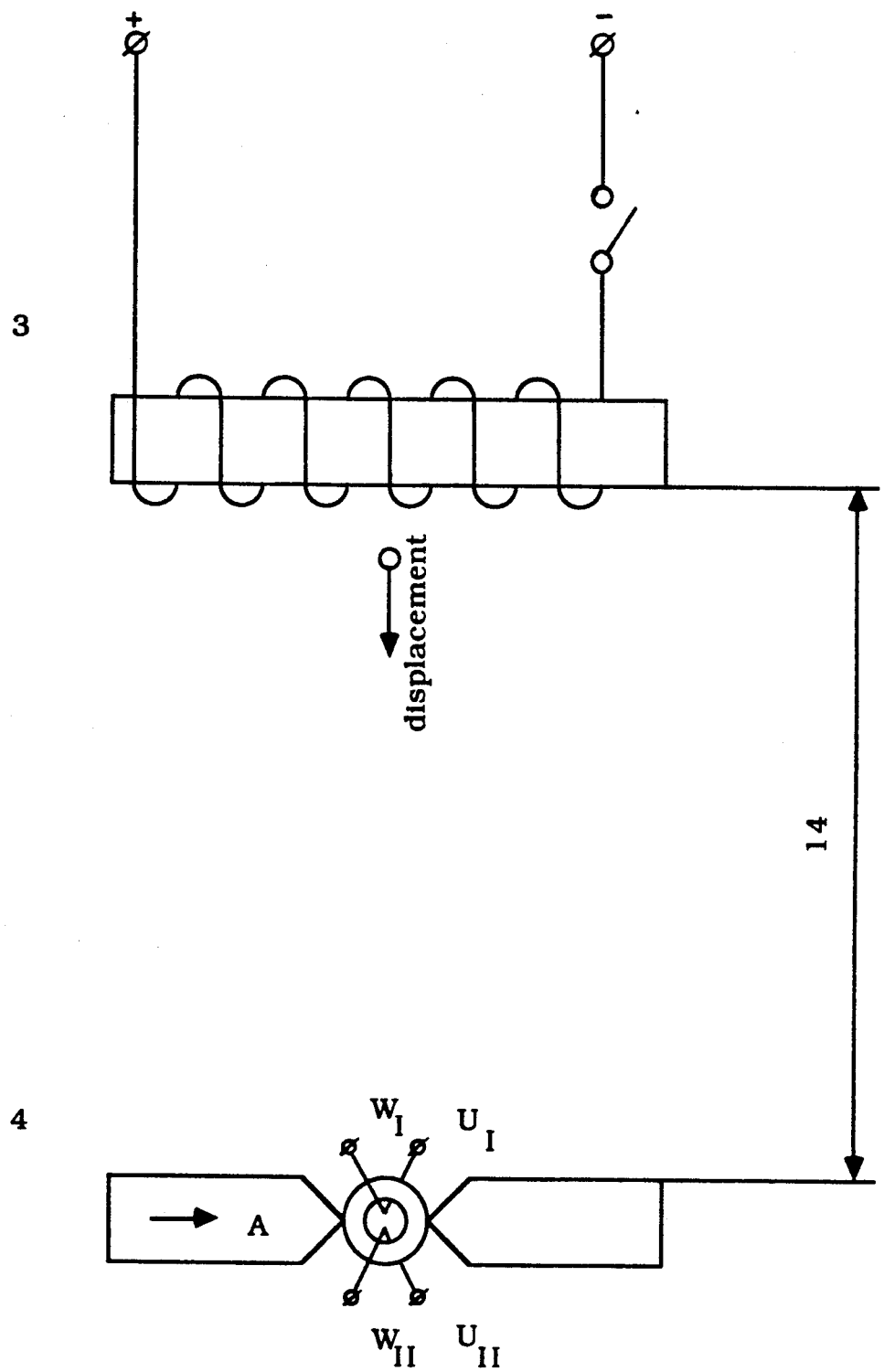
FIG. 2 shows one alternative of relative disposition of the source and sensor in the transducer.

If the core with activated magnetization process is brought into the external magnetic field created by electromagnet or by permanent magnet and disposed in a position where magnetic lines of forces of the external field are directed in the same plane that magnetomotive force of the primary winding $W_I$, then the core is magnetized in its diameter plane, shown by the arrow "A" on FIG. 2.

The magnetic flux of the external magnetic field, coming through the toroid core, branches along each of toroid's halves and, being superimposed, interacts with the alternative magnetomotive force of the primary winding $W_I$, which is directed along the perimeter of the closed magnetic circuit of the core, When the intensity of external magnetic field affecting the core is increased (for example, the source of external field proximates the sensor), the range of change of the induction is reduced and the core is remagnetized along reduced hysteresis loop; when the range of induction tends to zero (when the core tends to saturation), then peak voltage of the pulses induced in the secondary winding also tends to zero. When the intensity of external magnetic field near the core reaches some value corresponding to some specified distance between the source of external magnetic field and sensor (working clearance) and surpasses the magnetomotive force of the primary winding $W_I$, then the core is being saturated. Therefore, a specified level of the output pulses corresponds to a specified level of the intensity of the external magnetic field near the core.

When the range of the induction change is equal zero, there is no any change in the magnetic flux, the primary $W_I$ and the secondary $W_{II}$ windings become magnetically decoupled and the induced in the winding $W_{II}$ electromotive force is equal zero. When the intensity of external field is being reduced, then magnetic flux of the internal field between primary and secondary windings is being increased, the amplitude of the electromotive force induced in the secondary winding $W_{II}$ is increased and completely restored when the external field is completely eliminated.

The electromagnetic processes in the core of the sensor are characterized by magnetic and electrical parameters related to each other according to the electromagnetic induction law and the Ampere's circuital law.

A picture of hysteresis phenomenons in the toroidal core of the sensor when the core is magnetized by two simultaneously applied magnetic fields, is shown on FIG. 3.

The sensitivity of the core of the sensor depends on the intensity created by the external field near the core.

The magnetic energy of the external field is not entirely consumed by the sensor. To increase the portion of magnetic energy consumed by the core and the magnetic sensitivity of the sensor the latter has special elongated attachments made of non-retentive material having high magnetic permeability in weak magnetic fields and low residual induction in open magnetic circuit. These attachments attached to free of windings sectors of the core and concentrate and focus the flux of the concentrated external magnetic field into the core by the sharpen edges tightly attached to the core.

Figure 4:
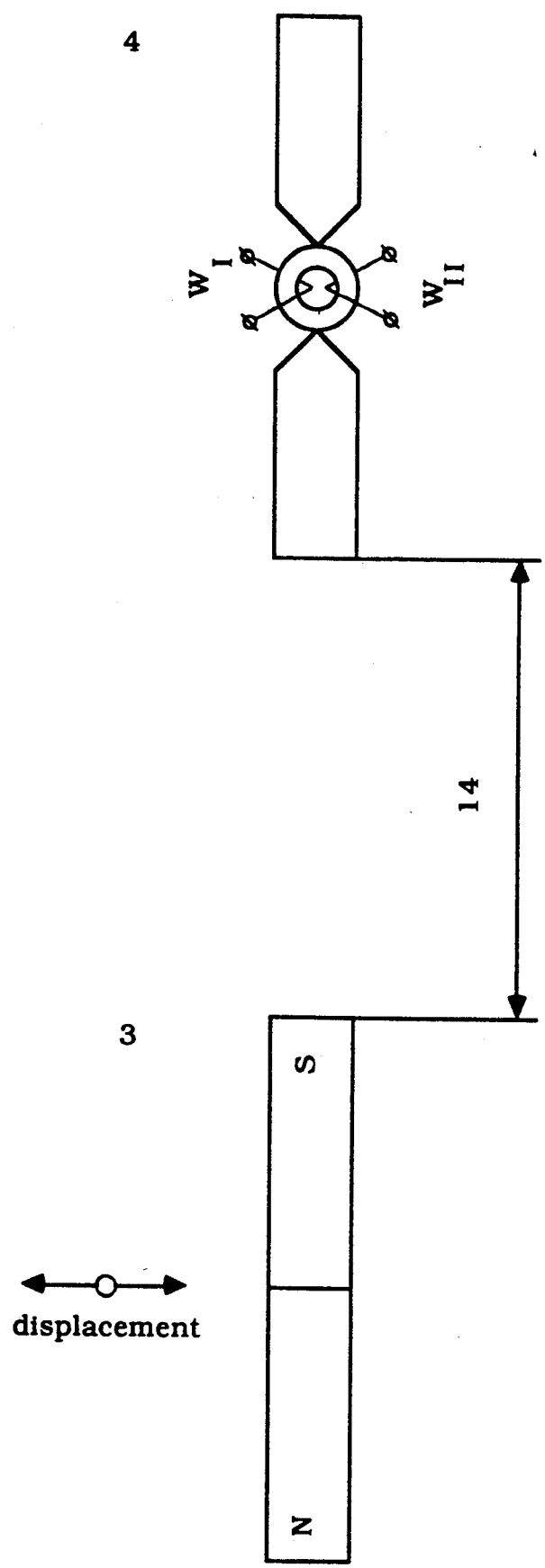
FIG. 4 shows the measuring transducer where the source of the external magnetic field and the sensor with the attachments are placed coaxially relatively to each other.

A number of transducers for various applications can be designed on the basis of the described operating principle. Using different configurations and shapes of the focusing attachments (and their number), sources of the external magnetic field (and their number), different space configurations of the external and the internal magnetic fields and control modes of the sensor and the source, a number of different devices and instruments can be designed. A transducer where the source and the sensor are connected to each other using rigid mechanical connection is useful. Herewith, the controlled objects are controlled by modifying the current in the electromagnet of the source or displacing the controlled objects in the external field. It is possible on the basis of such transducer to built acoustic measuring transducers, including microphone, hydrophone, laryngophone, geophone where magnetized membrane or other magnetized objects modulating the internal field in the core, will play the role of the source of the external field. There are also applications where the source of the external field (controlled objects are magnetized) is moving relatively to the sensor or the sensor is moving relatively to the source. Some interesting applications are found for such relative disposition of the sensor and the source where an axis of the attachments is substantially coaxial with an axis of the source of external magnetic field (FIG. 4). It is possible to provide precise point checking and control, substantially increase sensitivity of the transducer to small displacements, accuracy of measurement of displacement, speed and acceleration of the controlled objects, increase the slope of the external characteristic (change in the amplitude of the output pulses for a unit of change of the controlled object parameter (displacement, speed, acceleration or intensity of the field). Using different configurations and sizes of the attachments it is possible to built disk drive head, tape recorder head and other highly magnetically sensitive devices for detecting, sensing and measuring magnetically recorded data on the magnetic media (magnetic tape, magnetic disk) and significantly increase the density of the recording of the magnetic information by decreasing of the area of the magnetic contact between the sensor and the element of the magnetic media carrying useful information. To decrease the area of the magnetic contact between the element on the magnetic media and the attachments the latter have to have a very sharp tip and be placed close to the magnetic media. The best solution is to place (for reading and writing) a film of the magnetic media in the clearance gap formed by the tips of two coaxially displaced attachments because in such scheme the magnetic lines of forces are sharply concentrated between the tips and the area of the cross-section of the magnetic flux between the tips is minimal providing the maximum density of the magnetic media information written perpendicularly through the magnetic media. Herewith, the density of the magnetic data can be increased to a limit determined by a linear resolution of the magnetic media.

Figure 5:
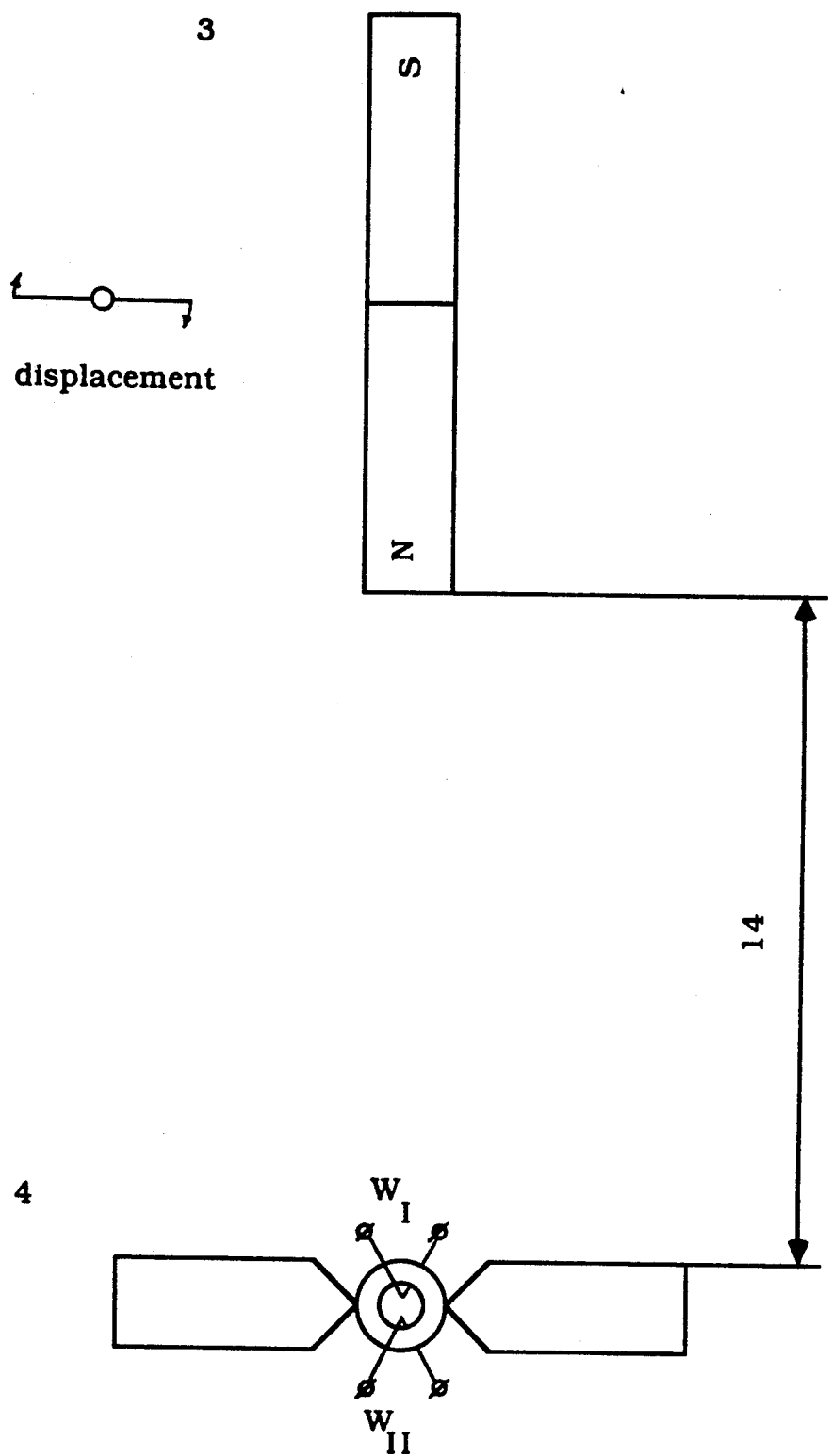
FIG. 5 shows an alternative of placement of the sensor and the source where they are displaced rotationally to each other.

In some of applications it is useful to have the sensor and the source of external field disposed in parallel (FIG. 2) to each other or to have their relative rotation. Herewith, a range of intensity is defined in limits between a position where the axis of the sensor with attachments (disposed along a single line) is parallel to the magnetic lines of forces of the source (maximum limit), and a position where this axis and these lines are perpendicular (FIG. 5) to each other (minimum limit).

Figure 6:
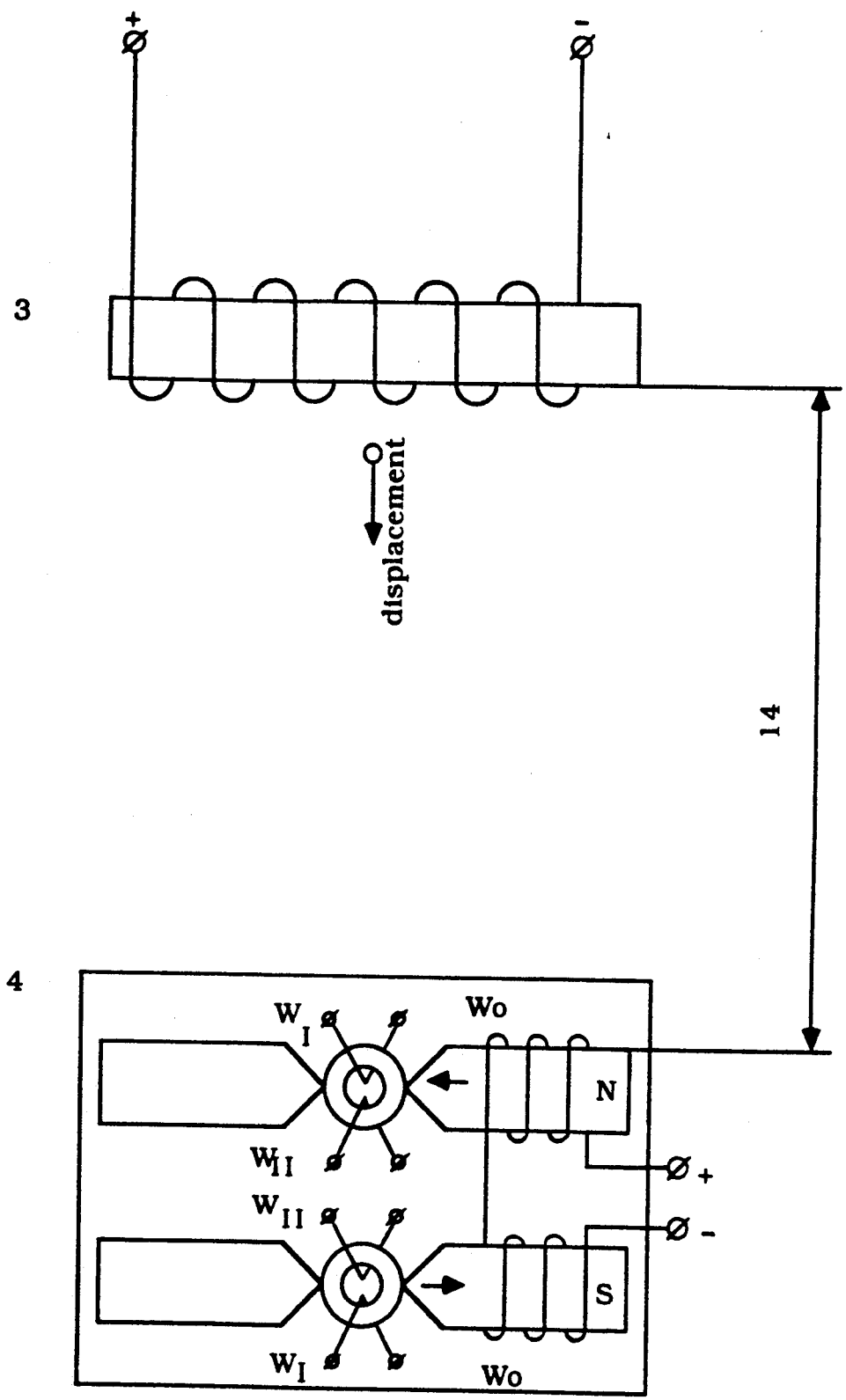
FIG. 6 shows an application where the measuring transducer is sensing a polarity of the source.

In some of applications there is an advantage of sensing a polarity of the source of external magnetic field which application is shown on FIG. 6.

Figure 8:
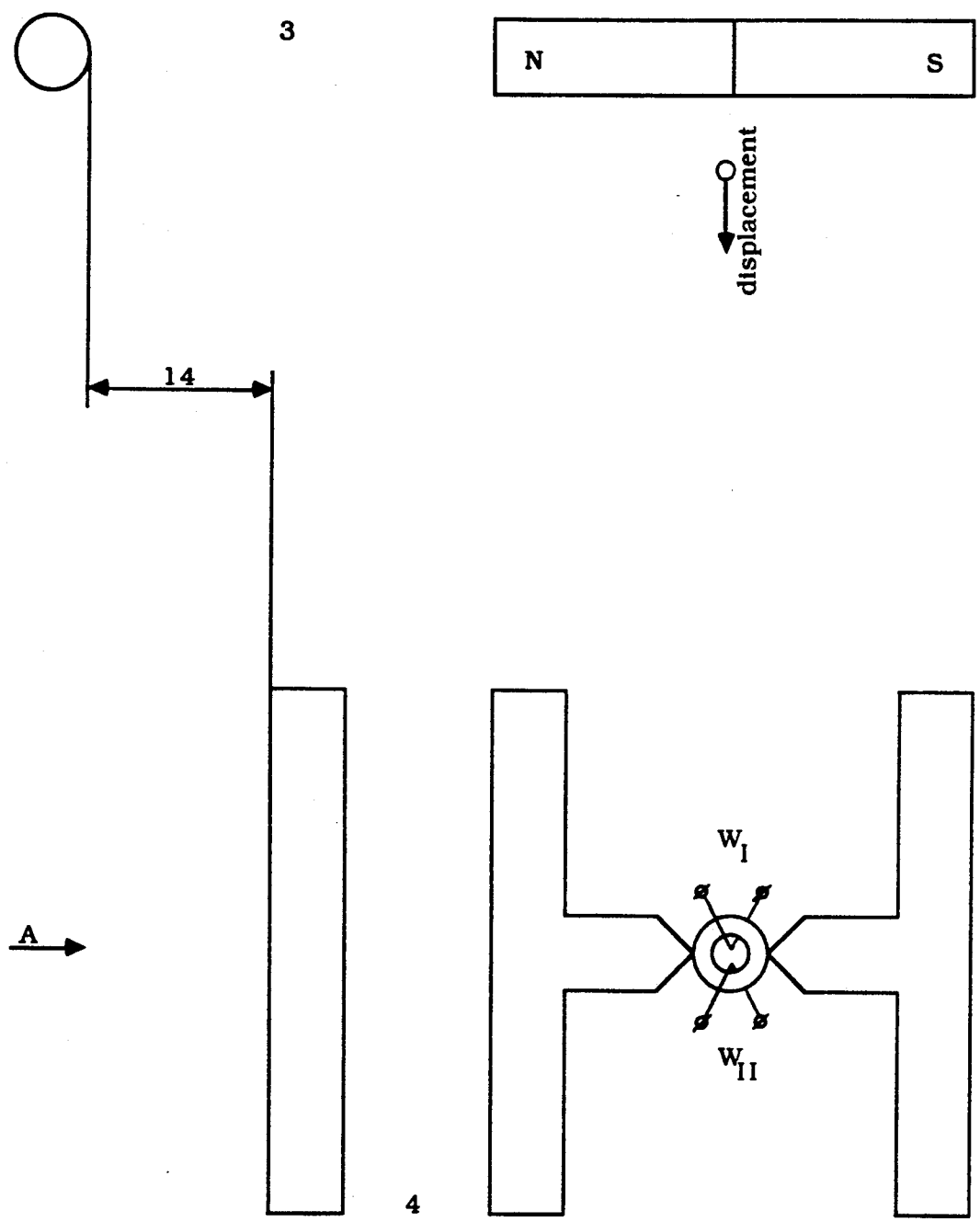
FIG. 8 shows a control (measurement) of the displacement of the linear sections.

If the controlled ferromagnetic object provides a complete shunting of the external magnetic field near the core (FIG. 7), it can be used as a point checking device or a device for accurate measurements of small displacements. If the controlled ferromagnetic object does not shunt completely the external magnetic field near the core of the sensor, it affects the intensity by redistribution of the magnetic fluxes of the external magnetic field in space (partial shunting). These transducers can be used for local point check, and control of linear sections (FIG. 8).

The basic principles to design the transducers are presented on FIGS. 2, 4, 5, 7, 8 and can be clearly seen from these drawings.

The operating principle of polar transducer (FIG. 6) consists in the following. Each toroidal core of the coupled sensor is being saturated by constant field of given polarity of auxiliary windings $W_o$ producing magnetomotive forces in opposite directions (arrows N and S on FIG. 6). When the source of the external magnetic field passes by the sensor at the distance of working clearance, then the saturation of one of the cores is compensated by the source of external magnetic field and the magnetization of this core is being decreased releasing the saturation of this core. At the same time another core is being more saturated by the increased intensity of similar polarity. Herewith, a signed difference between the levels at the outputs of these two sensors determines a polarity of the source. When a polarity of the source of the external field is changed, then the cores of the sensor are being switched to opposite state.

The electronic block 2 is comprising controlled clock generator 5, signal conditioner 6, comparator 7, manual input device 8, setting elements 9, output device 10, analog-to-digital converter 11, microprocessor 12 and stabilized power supply 13.

The clock generator 5 supply the primary winding $W_I$ of the core of the sensor 4. To achieve high speed of response its frequency can be increased to the highest for the particular ferromagnetic material of the core possible limit. The speed of response can be as high as a semi-period of the alternative current supplied to the primary winding. The maximum frequency of this alternative current is defined by the specifications of the core's material providing that at this frequency the sensor and the core are still operate within given requirements toward the accuracy and sensitivity of measurements.

The signal conditioner 6 converts output pulses of the secondary winding $W_{II}$ of the sensor 4 into the form (shape and level) which is compatible with the comparator 7 and with the analog-to-digital converter 11.

The frequency of the clock generator 5, and the input operating voltage of comparator 7 (when the comparator is being triggered) proportional to a specified working clearance "l" of the transducer 1, can be manually changed in some specified limits by manual input device 8 and setting elements 9.

The microprocessor 12 with a special software automatically change in given limits the frequency of the controlled clock generator 5, ranges of measured and applied to an analog-to-digital converter 11 output voltages of the transducer 1. Using its computational and logic capabilities microprocessor also linearizes the external (output-input) characteristic, suppresses noise, corrects functional specifications, compensates environmental disturbances, provides a diagnostics and other functions, and allows to achieve high sensitivity, accuracy, linearity, repeatability and the absence of hysteresis in the external characteristic.

The power supply 13 provides highly stable power supply parameters to supply electromagnet 3, controlled clock generator 5, and consequently, the primary winding $W_I$ of the core of the sensor 4, signal conditioner 6, comparator 7 and the setting elements 9.

The output device 10 forms signals to display set parameters and operating signals and sends them to the control system where the described magnetic converter is used.

Consider the operation of magnetic converter. Examine the version when the core of the sensor in its initial state has been magnetized by the external magnetic field and there are no any output pulses at the output winding $W_{II}$.

An analog processing circuitry including signal conditioner 6, comparator 7 and the output device 10 composes a series functional circuit for processing signals, received from the sensor 4, in analog form. A digital processing circuitry including analog-to-digital converter 11, embedded microprocessor 12 and digital device 10 is necessary to process the output signals in digital form.

If operating parameters are being input manually by the manual input device 8 and by setting elements 9, then the frequency of the generator 5 is set and also the level of operating voltage of the comparator 7 is set.

Then by one of the methods described above (different methods for different converter types) the core of this sensor is released from the magnetization by the external field and the induced pulses appear at the secondary winding $W_{II}$ (for example when the working clearance "l" between the source of external magnetic field 3 and the sensor 4 is being increased). When the working clearance is increased, the level of induced pulses is also increased. When this level reaches the level set at the comparator 7, the output signal is being restored. The minimum time to cease the magnetization of the sensor is a single semi-period of the alternative current in the primary winding having set frequency.

The microprocessor 12 plays the role similar to the described above, but in a discrete form. It provides the required speed of response by setting the necessary frequency of the controlled clock generator 5. The modified induced pulses of the sensor 4 are processed by signal conditioner 6, measured and converted into a discrete form by analog-to-digital converter 11. Then the modified pulses are being input to the microprocessor 12 where they are compared with the given levels in digital form. The result signals produced by comparison in analog or in digital form are being transmitted to the output device 10 where display and control signals are being formed.

Thus, changing set levels of operating voltage in analog form at comparator 7, or in discrete form at microprocessor 12 one can get the output signals proportional to the change of the working clearance in the range of the intensity of external magnetic field change, affecting the sensor core in the range from complete saturation to the state where the core is being remagnetized along maximum hysteresis loop.

The described measuring magnetic converter can be used in machinery, machine tools (including CNC-based), robotics, construction, metallurgy, mining industry, railroad automation, factory equipment and transportation, automobile industry, measurement and control instrumentation, different acoustic devices (geophysical sensors, microphone, hydrophone, laryngophone), various electromechanical and electronic equipment, as reading device to read data recorded magnetically on the magnetic media (magnetic disk drives, magnetic tape recorders etc.) and many others.

Besides, these transducers can be used as intermediate converters to measure other, than described above, physical quantities in applications for which these quantities are being converted into the intensity of the magnetic field, displacement, speed and acceleration which then are being measured.

What is claimed is:

1. A device for measuring an intensity of magnetic field and for measuring displacement, speed and acceleration of controlled ferromagnetic object in the magnetic field, said device comprising:

(a) a source of external magnetic field;
    (b) a sensor sensitive to the intensity of the magnetic field, said sensor having at least one O-shaped ferromagnetic core having a first sector and a second sector, said core having a closed magnetic circuit and a rectangular remagnetization hysteresis loop and having,
        a primary winding with a pair of primary terminals, said primary winding having at least one turn, a secondary winding with a pair of secondary terminals, said secondary winding having at least one turn, said hysteresis loop having an area changing with the change of the external magnetic field intensity, said area equal zero when the core is magnetically saturated.
    wherein the primary winding reeled around the first sector and the secondary winding reeled around the second sector of the core:
    (c) means for activating the primary winding with alternative current, said activating means connected to the primary terminals, said alternative current creating an internal magnetic field directed along the closed magnetic circuit of the ferromagnetic core and contained substantially entirely within the core, said internal magnetic field inducing positive and negative output pulses in the secondary winding and remagnetizing the core along the hysteresis loop;
    (d) means for detecting and measuring electrical parameters of the output pulses, said parameters including peak voltage of the output pulses, said detecting and measuring means connected to the secondary terminals;
    (e) means for controlling and setting the required intensity of the external magnetic field near the core, wherein the sensor is sensitive only to the motion of the controlled ferromagnetic object;
    (f) said controlled ferromagnetic object moving in the external magnetic field relatively to the core, said displacement of the controlled ferromagnetic object directly affecting and changing the intensity of the external magnetic field near the core,
    wherein, the measured intensity corresponding to a specified value of the displacement, the speed and the acceleration of the controlled object is converted into speed and acceleration of the changed measured intensity of the magnetic field near the core, wherein, a sensitivity of the measurement of the intensity is being increased when size of the core (a perimeter of the closed magnetic circuit and an area of cross-section of the core) is being reduced, wherein, said intensity of the external magnetic field is controlled by modifying,
- a strength of the external magnetic field created by the source,
- a distance between the source and the sensor,
- a polarity of the source,
- a position of the source and the sensor relatively to each other, and
- a position of the controlled object in the external magnetic field relatively to the sensor.

and by providing,
- redistribution of magnetic fluxes in space, said redistribution causing partial or entire shunting of the external magnetic field near the core,
- relative rotation of the sensor and the source,
- switching on and off of the source and the sensor, and
- synchronism and phase coincidence of the alternative current in the primary winding and the intensity of the external magnetic field to reduce and influence of noise signals on the measurement, each core further comprising a pair of ferromagnetic attachments, each attachment having a first end and a second end, each attachment outwardly attached to the core by the first end, said attachments made of non-retentive material having high magnetic permeability in weak magnetic fields and low residual induction in open magnetic circuit, said attachments concentrate a flux of the external magnetic field substantially near the core and focus the concentrated magnetic flux at the first ends of the attachments, said concentrated flux coming from the first end of a first attachment selected from the pair, through the core, to the first end of a second attachment of the pair, said focused flux of the external magnetic field branches within the core substantially near the first end of the first attachment into a pair of separate fluxes superimposed on the internal magnetic field flux circulating within the core, and then merges together substantially near the first end of said second attachment.

2. A device of claim 1 wherein the order to concentrate, sense and measure an intensity of the weak, remote and localized source of the external magnetic field near the core,
the second ends of the attachments form a clearance gap between said second ends, said magnetized controlled object moving substantially within the gap, providing the measurement of the intensity of the magnetic flux created by a disposed within the gap local magnetic point of the controlled magnetized object, wherein the decrease an area of magnetic contact between the second end and the magnetized controlled object and to increase the density of the localized external magnetic sources on the magnetized object, the second ends of the attachments are sharpened.

3. A device of claim 1 for controlling polarity of the source and a direction of the magnetic field near the core,
wherein said device having a first sensor with one said core, and a second sensor with one said core, and saturating means for saturating the core of the first sensor in a first direction by a first auxiliary magnetic field, and the core of the second sensor in a second direction by a second auxiliary magnetic field, the first auxiliary magnetic field created by a first auxiliary winding reeled around the attachment of the first sensor, the second auxiliary magnetic field created by a second auxiliary winding reeled around the attachment of the second sensor, said activating means comprising means for supplying direct current into the auxiliary windings, wherein the attachments disposed along a separate line in a plane defined by the closed magnetic circuit of the core to which said pair of the attachment is attached, wherein,
the first direction along the separate line of the first sensor is opposite to the second direction along the separate line of the second sensor;
the displacement of the controlled magnetized object causing redistribution of the intensity near the core of the external magnetic field superimposed on the auxiliary fields and causing,
- a decrease of the intensity near the core of the first sensor of a first total magnetic field composed of the first auxiliary field and the external magnetic field, and an increase of the peak voltage of said output pulses at the secondary winding of the first sensor due to decreased saturation and increased magnetic permeability of the core in said first sensor; and
- an increase of the intensity near the core of the second sensor of a second total magnetic field composed of the second auxiliary field and the external magnetic field, and a decrease of the peak voltage of said output pulses at the secondary winding of the secondary sensor due to increased saturation and decreased magnetic permeability of the core in said second sensor;

wherein said polarity of the source and direction of the displacement is determined by sign and value of a differential total intensity calculated as a signed difference between the intensity of the second total magnetic field and the intensity of the first total magnetic field.

4. A device of claim 1 wherein the attachments attached to the core at an angle to a plane defined by the closed magnetic circuit of the core.

5. A device of claim 1 wherein the means for detecting and measuring electrical parameters of the output pulses comprises a converter having,
means for synchronizing operation of the converter, said synchronizing means including a clock-generator and controlling synchronization of the alternative current in the primary winding,
an analog processing unit for processing the output signals in analog form, said processing unit having,
means for conditioning the output signals, said conditioning means having a first input and a first output, said output pulses are supplied from the secondary winding to the first input, conditioned signals are supplied at the first output,
comparator means to compare a level of the conditioned signals with a level preset by a manual set means, said comparator means having a second input and a second output, the conditioned signals are supplied to the second input and the compared signals are supplied from the second output to output means to display set parameters and operating signals, said manual set means provide an input of set parameters to control the operation of the device.

6. A device of claim 5 wherein the converter further comprises a digital processing unit for processing the conditioned signals in digital form, said digital processing unit having, analog-to-digital converter means to convert the conditioned analog signals at an input of the analog-to-digital converter means to digitized signals at an output of the analog-to-digital converter means, embedded microcomputer means controlling operation of the converter, modifying and correcting the preset levels and the conditioned signals in digital form, accuracy, sensitivity and speed of response, linearizing the external (output-input) characteristic, controlling noise, correcting functional specification, compensating environmental disturbances and providing diagnostics, wherein, said synchronizing means supply clock pulses to the microcomputer and the manual set means;

wherein, said digitized signals are supplied to the microcomputer for digital comparison with the preset levels and for digital processing defined by an algorithm of the converter functioning;

wherein, said speed of response and sensitivity can be optimally set by the microcomputer means and by manual set means.

7. A device of claim 1 further comprising, a pair of the sensors for controlling the straightness of the movement of the controlled magnetized object relatively said pair of the sensors along a straight line disposed in the plane perpendicular to a line connecting centers of the cores of said pair of the sensors, wherein the controlled magnetized object is moving at a specified distance to each of the sensors along the straight line, the cores of both sensors are magnetically influenced by said controlled magnetized object at said specified distance;

wherein the detecting and measuring means detect and measure the output signals at the secondary winding of both sensors influenced by the magnetized object, then the detected and measured signals of both sensors are compared to produce a differential signal proportional to the unstraightness of the movement of the controlled magnetized object.

8. A device of claim 1 wherein the source of magnetic field and the sensor disposed movably to each other.

9. The device of claim 8, wherein the source of magnetic field disposed rotationally to the sensor.

10. The device of claim 8, wherein the sensor disposed rotationally to the source of magnetic field.

11. A device of claim 5 triggered at a specified limit distance of the source from the sensor, in which the measured voltage at the secondary terminals is compared with a preset voltage, and the sensor is triggered when said measured voltage and said preset voltage become equal.

12. A device of claim 1 for measuring spacial displacement, speed and acceleration of the controlled ferromagnetic object relatively to a coordinate system having X axis, Y axis, and Z axis, said device having at least one X axis sensor, at least one Y axis sensor, and at least one Z axis sensor, each sensor comprising one said core with the attachments to control one dimensional displacement, speed and acceleration of the controlled object, then a vector of the spacial displacement, a vector of the spacial speed and a vector of the spacial acceleration are determined on the basis of the one-dimensional measurements performed by each said one-dimensional sensor, said vectors are determined on the basis of the Pythagorean theorem.

13. A device of claim 1 wherein the source of magnetic field is selected from the group consisting of a permanent magnet, a direct current electromagnet and an alternative current electromagnet.

14. A device of claim 13, wherein the increase noise immunity against external noisy electromagnetic fields, the alternative current in the primary winding is pulse current and the source of the external magnetic field is activated synchronously with the pulses of said alternative current in the primary winding, said device having means for synchronous activating of the source;

wherein the strength of the source of the magnetic field is phase coincident and synchronous with the alternative current in the primary winding.

15. A device of claim 1 wherein the alternative current activating the primary winding is selected from the group consisting of a sinusoid wave, a square wave and a triangle wave with a sharp leading edge.

16. A device of claim 1 for additional controlling the polarity of the source and a direction of the magnetic field near the core, said device having a first sensor with one said core, a second sensor with one said core and saturating means for saturating the core of the first sensor in a first direction by a first auxiliary magnetic field, and the core of the second sensor in a second direction by a second auxiliary magnetic field, the first direction is opposite to the second direction, wherein, the displacement of the controlled magnetized object re-distributing the intensity near the core of the external magnetic field superimposed on the auxiliary fields and causing, a decrease of the intensity near the core of the first sensor of a first total magnetic field composed of the first auxiliary field and the external magnetic field, and an increase of the peak voltage of said output pulses at the secondary winding of the first sensor due to decreased saturation and increased magnetic permeability of the core in said first sensor, and an increase of the intensity near the core of the second sensor of a second total magnetic field composed of the second auxiliary field and the external magnetic field, and a decrease of the peak voltage of said output pulses at the secondary winding of the secondary sensor due to increased saturation and decreased magnetic permeability of the core in said second sensor;

wherein said polarity of the source and direction of the displacement determined by sign and value of a differential total intensity calculated as a signed difference between the intensity of the second total magnetic field and the intensity of the first total magnetic field.

17. A device of claim 1 wherein the source of the magnetic field is substantially elongated and an axis of at least one attachment placed in a position selected from the group consisting of substantially coaxial and substantially parallel positions of the elongated attachment and the source.

* * * * *

UNITED STATES PATENT AND TRADEMARK OFFICE
CERTIFICATE OF CORRECTION

PATENT NO. : 5,280,239
DATED : January 18, 1994
INVENTOR(S) : Klimovitsky et al

It is certified that error appears in the above-indentified patent and that said Letters Patent is hereby corrected as shown below:

On the title page: Item [54] and Column 1, line 1, should read
—Precise Measuring Magnetic Converter—.

Column 11, line 24, instead of "and" must be —an—.
          line 57, instead of "the" must be —to—.
Column 14, line 13, instead of "the" must be —to—.

Signed and Sealed this

Second Day of May, 1995

Attest:

BRUCE LEHMAN

Attesting Officer      Commissioner of Patents and Trademarks